(12) United States Patent
Chabas

(10) Patent No.: US 6,246,297 B1
(45) Date of Patent: Jun. 12, 2001

(54) PHASE AND/OR FREQUENCY MODULATED FREQUENCY SYNTHESIZER HAVING TWO PHASE LOCKED LOOPS

(75) Inventor: Jean A. Chabas, Cesson Sevigne (FR)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/455,122

(22) Filed: Dec. 6, 1999

(30) Foreign Application Priority Data

Dec. 15, 1998 (FR) .................................................. 98 15838

(51) Int. Cl.[7] .................................. H03C 3/09; H03L 7/22
(52) U.S. Cl. .......................... 332/127; 332/128; 332/144; 455/113; 455/119
(58) Field of Search ..................................... 332/127, 128, 332/144; 455/110, 112, 113, 119

(56) References Cited

U.S. PATENT DOCUMENTS

| | | | |
|---|---|---|---|
| 4,313,209 | * | 1/1982 | Drucker ................................ 332/128 |
| 4,409,563 | * | 10/1983 | Vandegraaf ............................ 331/11 |
| 5,485,129 | * | 1/1996 | Franson et al. ........................ 332/101 |
| 5,734,302 | * | 3/1998 | Teng et al. ............................ 332/128 |
| 5,790,942 | * | 8/1998 | Le Corre et al. ...................... 332/127 |

* cited by examiner

Primary Examiner—Siegfried H. Grimm
(74) Attorney, Agent, or Firm—Jack D. Slobod

(57) ABSTRACT

This device includes a frequency synthesizer (12) comprising two phase-locked loops (L1 and L2). The one comprises a low-pass filter (68) and the other a high-pass filter (49). The loop with the low-pass filter fixes the basic frequency of the synthesizer and the other corrects the phase noise. With this arrangement it is easy to apply a modulation frequency to the terminal (11) that is not disturbed by said loops if this modulation frequency is found to be higher than the cut-off frequency of the low-pass filter.

5 Claims, 2 Drawing Sheets

PHASE AND/OR FREQUENCY MODULATED FREQUENCY SYNTHESIZER HAVING TWO PHASE LOCKED LOOPS

The present invention relates to a radio device comprising a frequency synthesizer for producing synthesized frequency signals, this synthesizer including a phase and/or a frequency modulation control for receiving a signal that presents a bandwidth called modulation bandwidth and this synthesizer being formed by at least two phase-locked loops.

The invention also relates to a method of phase and/or frequency modulating a frequency synthesizer.

Such devices are well known and find many applications, notably in the field of portable telephony devices that use a multitude of frequency channels determined by the synthesizer. One recollects that a synthesizer is, in essence, formed by a voltage-controlled variable oscillator intended to be slaved, by means of a phase-locked loop, to a frequency coming from a reference oscillator. A frequency divider is provided for finally determining the output frequency of the synthesizer.

One of the problems one is confronted with is the possibility of modulating the frequency and/or the phase of the variable oscillator. In effect, the presence of the phase-locked loop counterbalances the modulation, so that this modulation is hard to apply. Furthermore, one is also confronted with the problem of the phase noise that is generated by the digital frequency dividers the synthesizers habitually comprise working at a high frequency, for example, in the 800 MHz band.

From U.S. Pat. No. 4,409,563 is known to provide two loops for controlling the variable oscillator: one loop comprising a frequency discriminator and another loop comprising a phase discriminator. The loop comprising a frequency discriminator is used during a change of frequency or at the start, to facilitate the blocking of the variable oscillator to the reference oscillator, so that the loop comprising a phase discriminator can easily lock the variable oscillator. This known device is not at all confronted with the problem of the modulation of the variable oscillator.

The invention proposes a device in which are provided means for modulating the frequency and/or the phase of the variable oscillator while maintaining a satisfactory phase locking while ensuring a reduced level of phase noise.

Therefore, such a device is characterized in that at least a first phase-locked loop is provided of the high-pass type, and a second phase-locked loop of the low-pass type whose cut-off is smaller than said modulation band.

Thus, thanks to the invention, the basic frequency of the synthesizer is locked by the low-pass phase-locked loop, while this loop does not affect the modulation signals that are produced at a higher frequency. The phase noise is attenuated by the high-pass phase-locked loop.

The method according to the invention is characterized in that a first phase-locked loop is used of the high-pass type, and a second phase-locked loop of the low-pass type, whose cut-off is smaller than said modulation band.

These and other aspects of the invention are apparent from and will be elucidated, by way of non-limitative example, with reference to the embodiment(s) described hereinafter.

Figure 1:
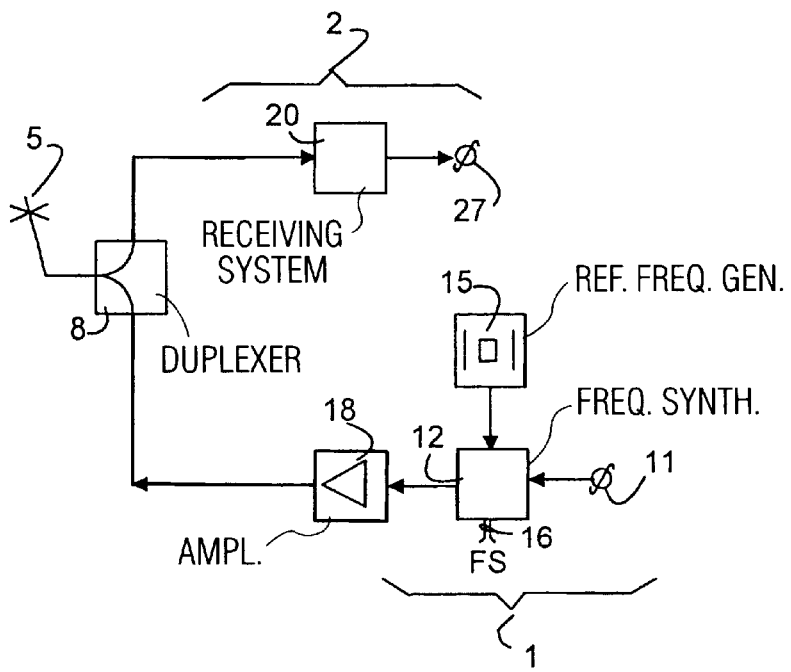
FIG. 1 shows a device in accordance with the invention.

In FIG. 1 is shown a radio device in accordance with the invention. This device is a transceiver of the type provided for portable radiotelephones, for example. It is formed by a transmission circuit 1 and a receiving circuit 2 coupled to an antenna 5 via a duplexer 8. The transmission circuit 1 is formed by input terminal 11 for receiving modulation signals. This modulation phase-modulates and/or frequency-modulates a carrier produced by a frequency synthesizer 12. This synthesizer uses the frequency signals FR processed by a reference frequency generator 15 in order to produce the signals at a frequency FS, defined by the use with the aid of the frequency control 16. The output signal of the synthesizer 12 is then amplified by an amplifier 18 before it is applied to the antenna 5. The receiving circuit 2 is formed by a receiving system 20 for supplying data to an output terminal 27.

Figure 2:
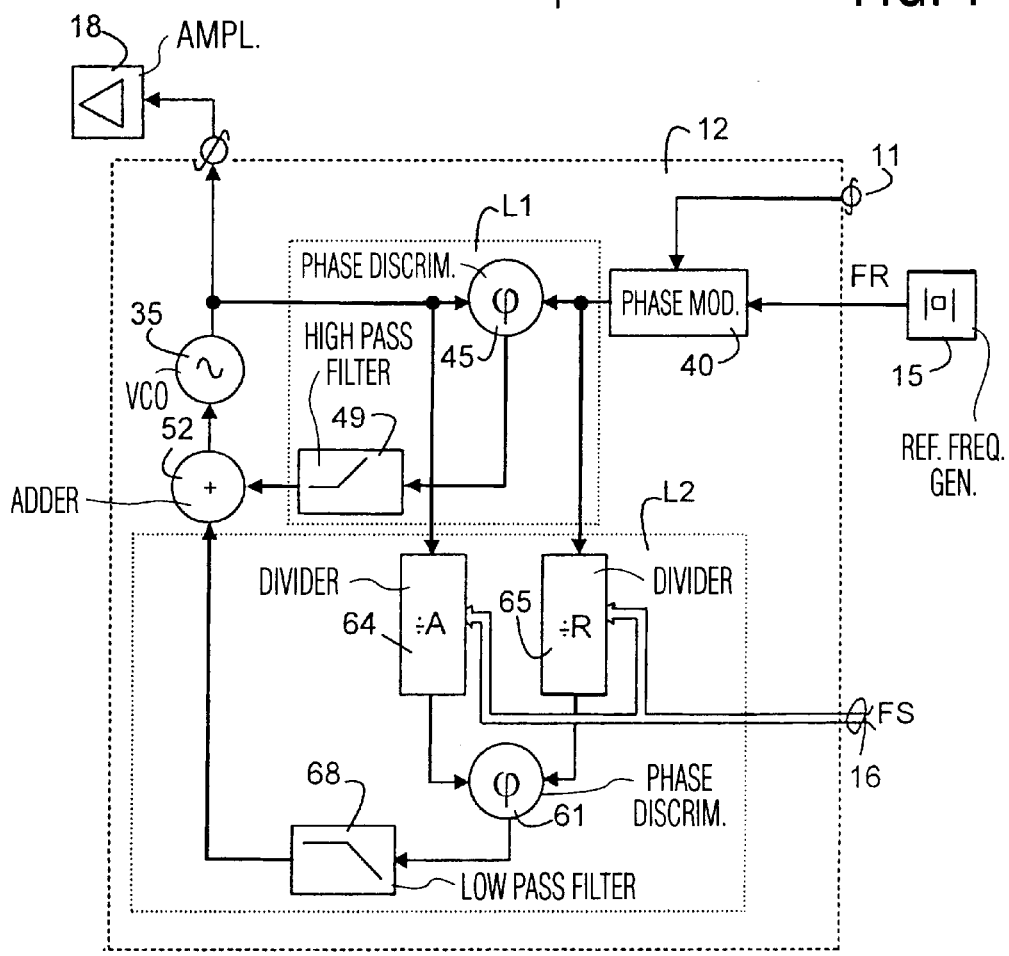
FIG. 2 shows the diagram of a synthesizer forming part of the device of FIG. 1.

FIG. 2 shows the structure of the synthesizer 12 realized in accordance with the invention. It comprises a voltage-controlled variable oscillator 35 whose output is connected to the amplifier 18. The modulation signal applied to the terminal 11 acts on a phase modulator 40 connected, according to one possibility, to the output of the reference frequency generator 15. This synthesizer 12 includes a first loop L1. This loop L1 is formed by a phase discriminator 45 of which one input is connected to the output of the variable oscillator 35 and the other to the output of the phase modulator 40. The difference signal between the phase of the output signal of the oscillator 35 and that of the output signal of the phase modulator 40 is applied to the frequency control of the voltage-controlled variable oscillator 35 via a high-pass filter 49 and an adder 52.

A second loop L2 is provided, formed by a second phase discriminator 61, whose inputs are also connected to the output of the oscillator 35 and that of the modulator 40 via, possibly, dividers 64 and 65, which divide by a number A and R, respectively. These numbers depend on the desired frequency FS whose value is applied to the control 16. The output of this discriminator 61 is also connected to the frequency control of the voltage controlled variable oscillator 35 via a filter 68 and via the adder 52 which also combines the action of the two loops L1 and L2. According to the invention, the filter 68 is a low-pass filter.

The frequency of the signal produced by this synthesizer is thus: FS=A/R FR. Thus, thanks to the loop L1, the oscillator 35 is locked on to the reference frequency over a large bandwidth. It will be noted that the loop L1 does not include a frequency divider that causes noise.

The loop L2 may function at a frequency that is much lower than the modulation frequency, which provides that this modulation frequency will not be impeded by this loop L2 that will maintain the carrier frequency of the output signal of the synthesizer.

Figure 3:
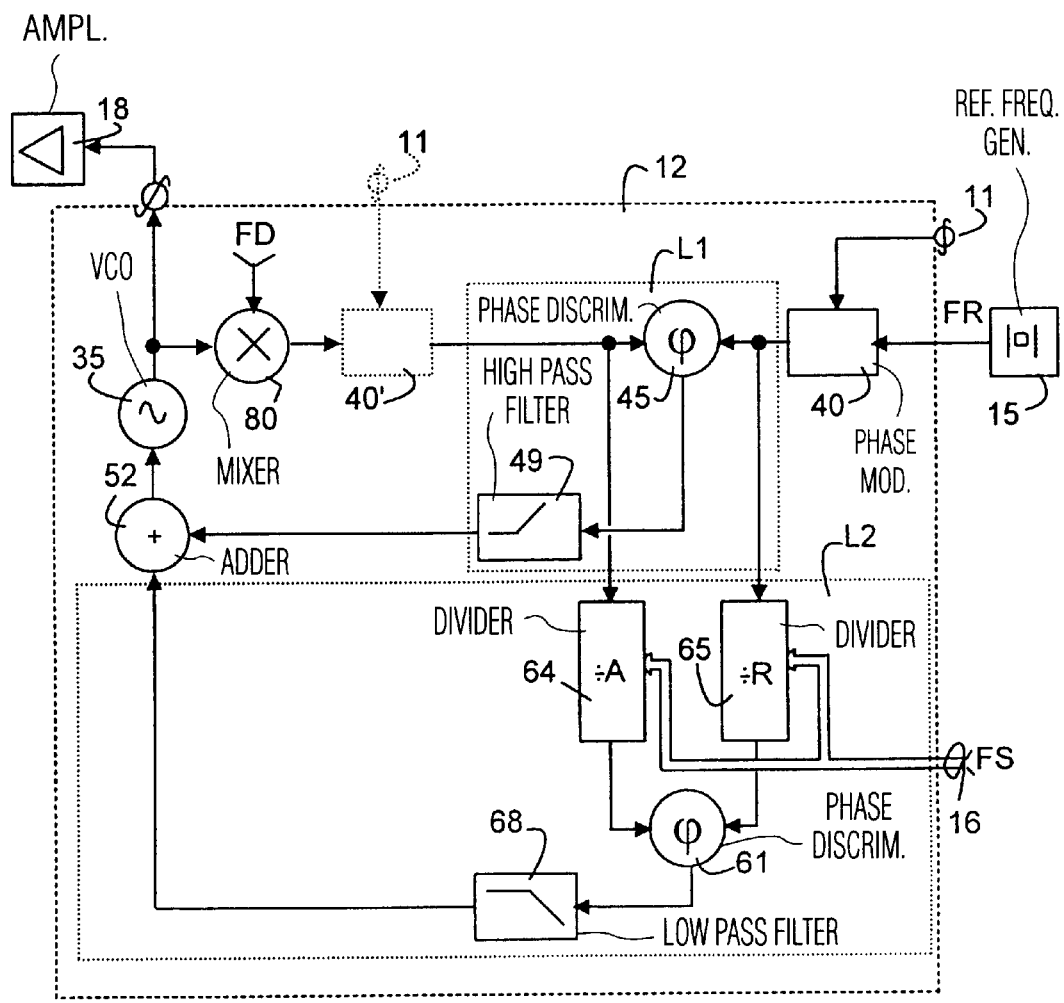
FIG. 3 shows the diagram of other embodiments of a synthesizer in accordance with the invention.

FIG. 3 exhibits other embodiments of the invention. In this Figure the elements that are in common with those of the preceding Figures carry like reference numbers.

A first embodiment consists of putting the phase and/or frequency modulator at the other input of the phase discriminator 45. It is represented in a dotted line in the Figure and carries reference 40'. It is also possible to have two such modulators.

A second embodiment consists of providing a mixer 80 inserted between the output of the oscillator 35 and the discriminator 45. Thus, the operating frequency of the first loop is lowered without introducing too much noise. Indeed, the frequency dividers are considered to produce too much noise.

By way of example, for frequencies to be produced of the order of 800 MHz, the low-pass phase-locked loop has a passband from 0 to 1 kHz, whereas the high-pass phase-locked loop has a passband practically from 1 kHz to 300 kHz. The modulation frequency is thus to be higher than the cut-off frequency of the low-pass loop, that is to say, 1 kHz.

What is claimed is:

1. A radio device comprising a frequency synthesizer (12) for producing synthesized frequency signals, this synthesizer including a phase and/or a frequency modulation control (11) for receiving a signal that presents a bandwidth called modulation bandwidth and this synthesizer being formed by at least two phase-locked loops (L1, L2), characterized in that at least a first phase-locked loop (11) is provided of the high-pass type, and a second phase-locked loop (L2) of the low-pass type whose cut-off is smaller than said modulation bandwidth.

2. A device as claimed in claim 1, for which the synthesizer (12) co-operates with a reference frequency generator (15), characterized in that a frequency and/or phase modulator (40) is provided connected to the output of this frequency generator for receiving said modulation control.

3. A device as claimed in claim 1, for which said synthesizer comprises a variable frequency oscillator (35) for producing the synthesized frequency signals, and a reference frequency generator (15), characterized in that a frequency and/or phase modulator (40') is provided connected to the output of said variable frequency oscillator for receiving said modulation control.

4. A device as claimed in claim 1, characterized in that the synthesizer comprises a mixer circuit (80) for changing the frequency of a variable frequency oscillator in one of the loops.

5. A method implemented in a device as claimed in claim 1 for controlling a frequency synthesizer (12) modulated by frequency and/or phase-modulated signals that have a modulation bandwidth, characterized in that a first phase-locked loop (L1) is used of the high-pass type and a second phase-locked loop (L2) of the low-pass type whose cut-off frequency is lower than said modulation bandwidth.

* * * * *